US010768335B1

(12) United States Patent
Dementyev et al.

(10) Patent No.: US 10,768,335 B1
(45) Date of Patent: Sep. 8, 2020

(54) SADDLE POINT NUCLEAR MAGNETIC RESONANCE TOOL FOR MEASUREMENTS AT MULTIPLE DEPTHS OF INVESTIGATION

(71) Applicant: Schlumberger Technology Corporation, Sugar Land, TX (US)

(72) Inventors: Anatoly Dementyev, Sugar Land, TX (US); Henry Bachman, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 16/289,063

(22) Filed: Feb. 28, 2019

(51) Int. Cl.
*G01V 3/32* (2006.01)
*G01N 24/08* (2006.01)
*H01Q 1/04* (2006.01)
*G01V 3/34* (2006.01)

(52) U.S. Cl.
CPC .............. *G01V 3/32* (2013.01); *G01N 24/081* (2013.01); *G01V 3/34* (2013.01); *H01Q 1/04* (2013.01)

(58) Field of Classification Search
CPC .......... G01V 3/32; G01V 3/34; G01N 24/081; H01Q 1/04
See application file for complete search history.

(56) References Cited

U.S. PATENT DOCUMENTS

| 6,411,087 B1 | 6/2002 | Fan et al. |
| 6,489,763 B1 | 12/2002 | Goswami et al. |
| 2012/0209541 A1 | 8/2012 | Ong et al. |
| 2016/0033670 A1* | 2/2016 | Reiderman .............. G01V 3/32 |
| | | 324/303 |
| 2018/0003852 A1 | 1/2018 | Jachmann et al. |

FOREIGN PATENT DOCUMENTS

WO 2006043272 A2 4/2006

OTHER PUBLICATIONS

Extended Search Report issued in the EP Application 20159872.9, dated Jun. 22, 2019 (15 pages).

* cited by examiner

*Primary Examiner* — Gregory H Curran
(74) *Attorney, Agent, or Firm* — Trevor G. Grove

(57) ABSTRACT

The present disclosure relates to generating multiple depths of investigation (DOI) measurements with a saddle point design nuclear magnetic resonance sensor. In general, an NMR sensor in accordance with the present disclosure includes a first magnet at a first radial distance from a radial center, and a second magnet at a second radial distance from the radial center. The first magnet at least partially cancels out a magnetic field gradient produced by the second magnet. Further, the NMR sensor may include an antenna that generates a first set of NMR data from a first DOI by operating at a first frequency and, generates a second set of NMR data from a second DOI by operating a second frequency. Additional frequencies are possible and envisioned.

17 Claims, 8 Drawing Sheets

US 10,768,335 B1

SADDLE POINT NUCLEAR MAGNETIC RESONANCE TOOL FOR MEASUREMENTS AT MULTIPLE DEPTHS OF INVESTIGATION

BACKGROUND

This disclosure generally relates to nuclear magnetic resonance (NMR) logging and, more specifically, to techniques for generating NMR data at multiple depths of investigation (DOI).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Producing hydrocarbons from a wellbore drilled into a geological formation is a remarkably complex endeavor. In many cases, decisions involved in hydrocarbon exploration and production may be informed by measurements from downhole well-logging tools that are conveyed deep into the wellbore. The measurements may be used to infer properties or characteristics of the geological formation surrounding the wellbore.

One type of downhole well-logging tool uses nuclear magnetic resonance (NMR) to measure the response of nuclear spins in formation fluids to applied magnetic fields. Many NMR tools have a permanent magnet that produces a static magnetic field at a desired test location at a depth of a well (e.g., where the fluid is located). The static magnetic field produces an equilibrium magnetization in the fluid that is aligned with a magnetization vector along the direction of the static magnetic field. A transmitter antenna produces a time-dependent radio frequency magnetic field that is perpendicular to the direction of the static field. The radio frequency magnetic field produces a torque on the magnetization vector that causes it to rotate about the axis of the applied radio frequency magnetic field. The rotation results in the magnetization vector developing a component perpendicular to the direction of the static magnetic field. This causes the magnetization vector to align with the component perpendicular to the direction of the static magnetic field, and to precess around the static field. This produces NMR measurements for a single depth of investigation (DOI) extending from inside the well to the geological formation. The characteristics of the geological formation may vary, however, for a different DOI.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

One embodiment in accordance with aspects of the present disclosure relates to a device for generating nuclear magnetic resonance (NMR) data. The device includes a first magnet configured to generate a magnetic moment and a first magnetic field profile. Further, the device includes a second magnet disposed at a first position separate from the first magnet at a distance along a direction of the device, wherein the second magnet combines with the first magnet to generate a second magnetic field profile, wherein a the angles between the first moment direction and the second moment direction is greater than 90 degrees, and wherein a net magnetic field produced by at least the first magnet and the second magnet has a magnetic field profile that is suitable for multiple depth of investigation measurements (DOI). Further still, the device includes an antenna that is configured to generate a first set of NMR data from a first DOI operating at a first frequency. The antenna is also configured to generate a second set of NMR data from a second DOI operating at a second frequency. The magnetic field profile includes a saddle point sample region wherein the gradient of magnetic field is zero, that is, negligibly small. Additional frequencies of operation will have a non-zero gradient. A benefit of the design is to maintain the saddle point sample region while minimizing the gradients at the other DOIs, that is, for other frequencies of operation. Another benefit is to minimize or eliminate NMR signal arising from the borehole at one or more frequencies of operation.

Another embodiment in accordance with aspects of the present disclosure relates to a downhole tool for measuring properties of a geological formation. The downhole tool includes a nuclear magnetic resonance (NMR) sensor, wherein the NMR sensor comprises more than two magnets. The downhole tool also includes a first magnet disposed at a first radial distance from a radial center of the NMR sensor, wherein the first magnet is configured to generate a first magnetic field moment and profile. Further, the downhole tool includes a second magnet disposed at a second radial distance from the radial center of the NMR sensor, wherein the second magnet generates a second magnetic moment, wherein a first angle between the first magnet's moment direction and the second magnet's moment direction is greater than 90 degrees. Further still, the downhole tool includes a third magnet disposed at a third radial distance from the radial center of the NMR sensor, wherein the third magnet generates a third magnetic moment in a third direction that is opposite of the first direction, and wherein a second angle between the third magnet's moment direction and the first magnet's moment direction is greater than 90 degrees. Even further, the downhole tool may include a fourth magnet disposed at a fourth radial distance from the radial center of the NMR sensor, wherein the fourth magnet is configured to generate a fourth magnetic field moment along a fourth direction that is opposite of the first direction, and wherein a third angle between the fourth magnet's moment direction and the first magnet's moment direction is greater than 90 degrees. In some embodiments, the first magnet, the second magnet, the third magnet, and the fourth magnet are separate from each other, wherein a net magnetic field produced by the first magnet, the second magnet, and the third magnet has a magnetic field profile that is suitable for multiple depth of investigation measurements (DOI). Even further still, the downhole tool includes an antenna configured to generate a first set of NMR data from a first DOI at a first frequency. The antenna is also configured to generate a second set of NMR data from a second DOI at a second frequency. Additional frequencies are possible and envisioned.

Another embodiment in accordance with aspects of the present disclosure relates to a method of manufacturing a nuclear magnetic resonance (NMR) sensor for a downhole tool. The method includes providing an antenna configured to generating at least one set of NMR data. The method also includes providing a first magnet at a first radial distance from a radial center of the NMR sensor, wherein the first magnet is configured to generate a first magnetic field profile. Further, the method includes providing a second magnet at a second radial distance from the radial center of the NMR sensor, wherein the second magnet generates a second magnetic moment along a second direction, wherein a first angle between the first magnet's moment direction and the second magnet's moment direction is greater than 90 degrees.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
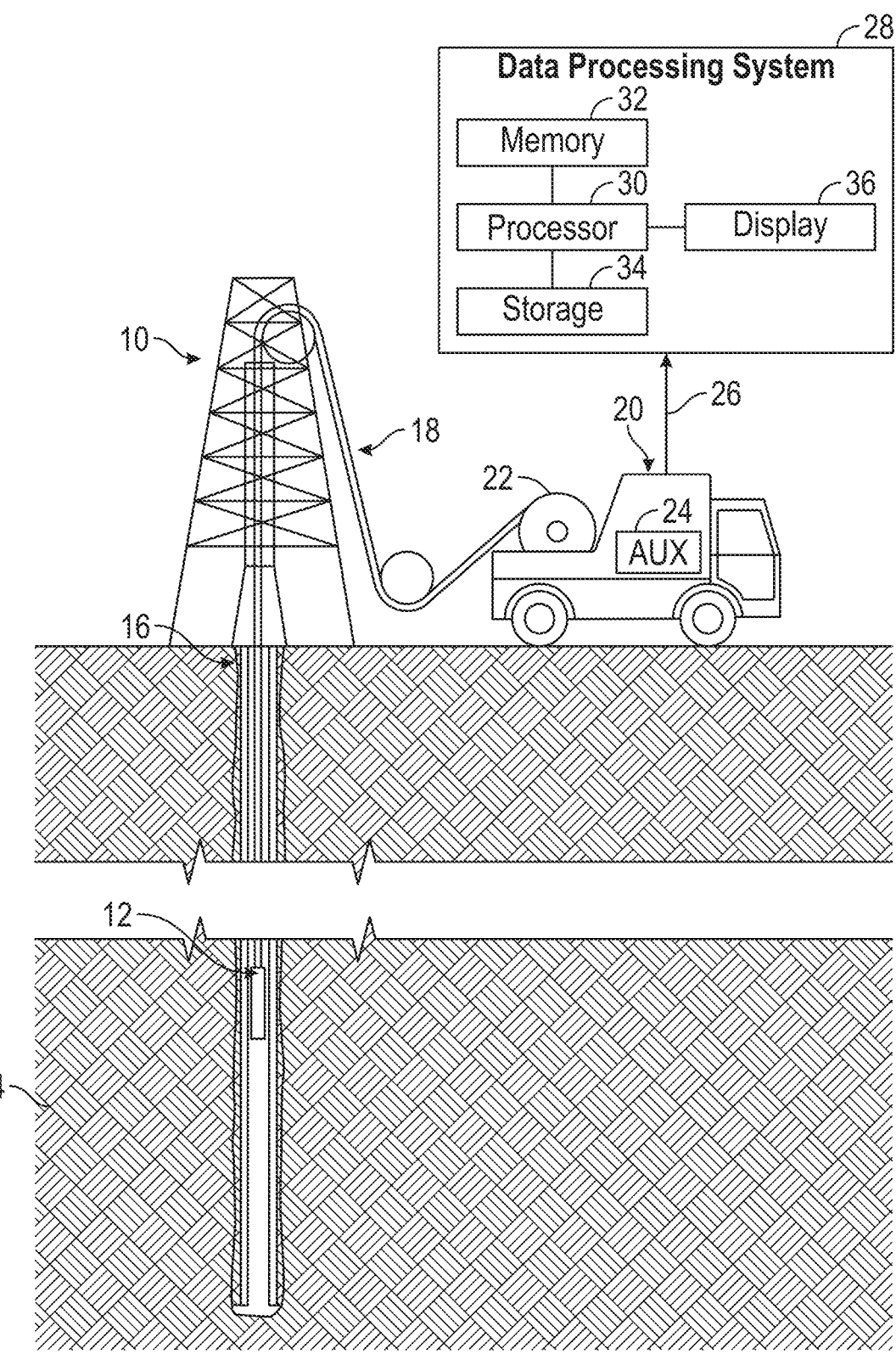
FIG. 1 shows an example wireline-, slickline- or coiled-tubing-conveyed NMR well logging downhole tool moving along the interior of a wellbore drilled through a subsurface geological formation, in accordance with aspects of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. As referred to herein, "approximately" refers to ±10% of some value.

In general, NMR logging tools include at least an antenna that generates radio-frequency (RF) magnetic fields and one or more magnets that generate a static magnetic field. Two types of static magnet fields that may be produced by the one or more magnets that are employed in downhole devices (e.g., NMR logging tools) include saddle point magnetic fields (e.g., as produced by NMR logging tools that use saddle point designs) and gradient magnetic fields (e.g., as produced by NMR logging tools that use gradient designs). The saddle point field location has a zero gradient of magnetic field, while other locations have non-zero gradient. NMR logging tools that employ saddle point designs may produce NMR data that has a relatively high signal to noise ratio (SNR), compared to certain other designs, due to measuring a higher sensitive region volume. However, certain saddle point designs may be sensitive to magnetic debris and are unable to generate sufficiently high SNR at multiple depth of investigation measurements (DOI). Gradient designs may produce multiple DOI measurements at positions (e.g., depths) along a magnetic field that has a suitable gradient. In general, a gradient of a magnetic field that is suitable for producing multiple DOI measurements has a magnetic field profile with a gradient between approximately 30-40 G/cm for at least two positions along the magnetic field profile. The spacing between the two positions should be of a suitable distance such that the two frequencies used to measure each position do not completely or substantially interfere with each other, as it should be understood by one of ordinary skill in the art.

The present disclosure generally relates to techniques for generating multiple DOIs in a saddle point magnetic field. In general, the techniques include an arrangement of magnets or magnet sections (e.g., each section having multiple magnets) having at least one magnet that produces a first magnetic moment in a direction, and a second magnet that produces a second magnetic moment in a direction generating a magnetic field profile that at least partially cancels out part of the first magnetic field gradient. For example, the arrangement of magnets may include a first magnet positioned or disposed in front of (e.g., towards the area of a geological formation being measured) of the antenna, and a second magnet that is disposed at a second position separate from the first magnet. In some embodiments, the arrangement of magnets may include three, four, five, or more magnets of magnet sections. In some embodiments, the first magnet has a cross-sectional area that is smaller than a cross-sectional area of the other magnets (e.g., second magnet and/or third). It is presently recognized that such an arrangement of magnets may reduce certain size constraints within a sensor and/or the downhole tool. Moreover, the present techniques may improve SNR in NMR logging tools (e.g., downhole tools that include NMR sensors), as well as providing information related to fluid invasion profiles at multiple depths.

Figure 8:
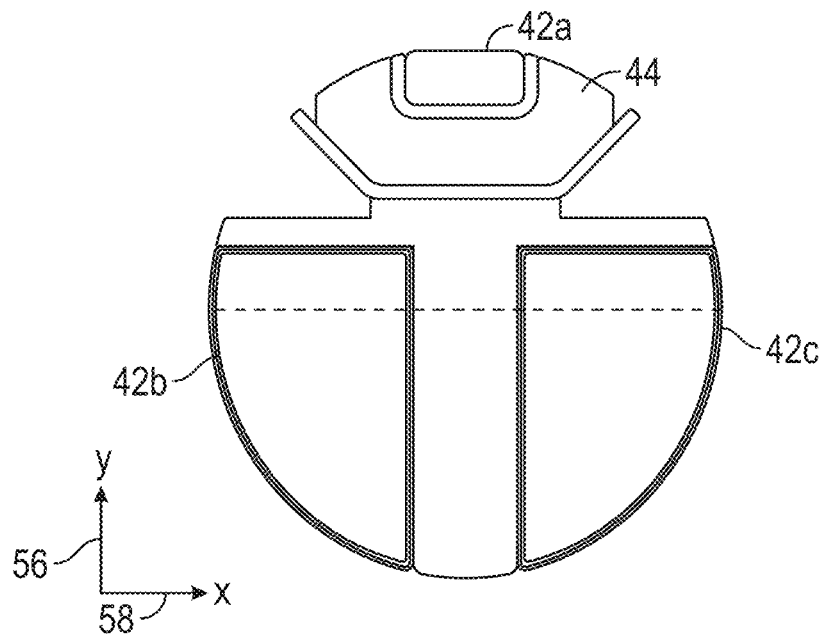
FIG. 8 shows a cross section of the NMR sensor shown in FIG. 5B, in accordance with aspects of the present disclosure.

With this in mind, FIG. 1 illustrates a well-logging system 10 that may employ the systems and methods of this disclosure. The well-logging system 10 may be used to convey a downhole tool 12 through a geological formation 14 via a wellbore 16. The downhole tool 12 may be conveyed on a cable 18 via a logging winch system 20. Although the logging winch system 20 is schematically shown in FIG. 8 as a mobile logging winch system carried by a truck, the logging winch system 20 may be substantially fixed (e.g., a long-term installation that is substantially permanent or modular). Any suitable cable 18 for well logging may be used. The cable 18 may be spooled and unspooled on a drum 22 and an auxiliary power source 24 may provide energy to the logging winch system 20 and/or the downhole tool 12.

Moreover, although the downhole tool 12 is described as a wireline downhole tool, it should be appreciated that any suitable conveyance may be used. For example, the downhole tool 12 may instead be conveyed as a logging-while-drilling (LWD) tool as part of a bottom hole assembly (BHA) of a drill string, conveyed on a slickline or via coiled tubing, and so forth. For the purposes of this disclosure, the downhole tool 12 may be any suitable measurement tool that obtains NMR logging measurements through depths of the wellbore 16.

To this end, the data processing system 28 thus may be any electronic data processing system that can be used to carry out the systems and methods of this disclosure. For example, the data processing system 28 may include a processor 30, which may execute instructions stored in memory 32 and/or storage 34. As such, the memory 32 and/or the storage 34 of the data processing system 28 may be any suitable article of manufacture that can store the instructions. The memory 32 and/or the storage 34 may be ROM memory, random-access memory (RAM), flash memory, an optical storage medium, or a hard disk drive, to name a few examples. A display 36, which may be any suitable electronic display, may provide a visualization, a well log, or other indication of properties in the geological formation 14 or the wellbore 16 using the logging measurements 26.

Figure 2:
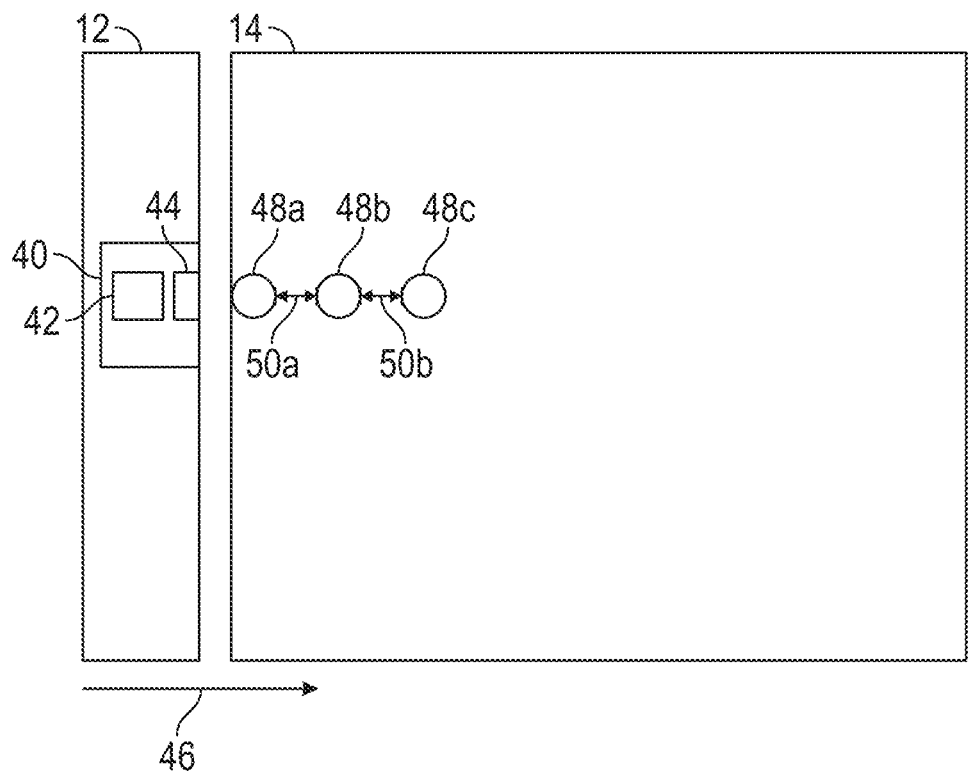
FIG. 2 shows a schematic illustration of a downhole tool that includes an NMR sensor, in accordance with aspects of the present disclosure.

FIG. 2 shows a schematic illustration of a downhole tool 12 that includes an NMR sensor 40. As illustrated the NMR sensor 40 includes a magnet 42 and an antenna 44, which may be employed to determine characteristics of the geological formation 14 using NMR. In general, the magnet 42 produces a static magnet field (e.g., Bo) with an amplitude that may vary with respect to a lateral distance (e.g., in the direction 46) from the magnet 42. The antenna 44 generally induces radio frequency (RF) magnetic fields (e.g., $B_1$) that are substantially orthogonally polarized with reference to the polarization direction of the static magnetic field produced by the magnet 42. In operation, the magnet 42 and the antenna 44 generally cooperate to generate NMR data at a DOI 48 within the geological formation 14. It should be noted that the antenna 44 may produce NMR data at a DOI when there is a suitable gradient (Gauss/distance) of the static magnetic field. For example, a suitable gradient for the DOIs which are not at the saddle point DOI may typically be between 30 to 40 G/cm (e.g., 30, 31, 32, 33, 34, and so forth). In some embodiments, the antenna may produce NMR data from multiple DOIs 48 using different frequencies when a distance (e.g., the distance 50a between 48a and 48b, and/or the distance 50b between 48b and 48c) between two DOIs is of a sufficient amount related to the frequency of the RF magnetic field produced by the antenna 44.

Figure 3:
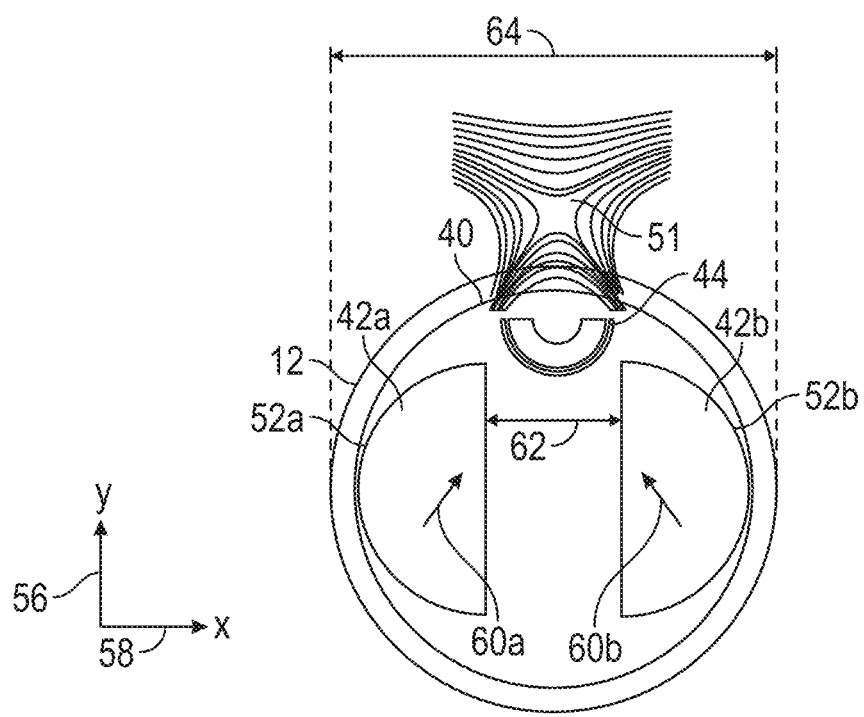
FIG. 3 shows a cross section of an NMR sensor for the downhole tool configured to produce a saddle point magnetic field, in accordance with aspects of the present disclosure.

FIG. 3 shows a cross section of an NMR sensor 40 for the downhole tool 12 that produces a saddle point magnetic field 51, in accordance with aspects of the present disclosure. As illustrated, the NMR sensor 40 includes a first magnet section 52a having magnet 42a, a second magnet section 52b having magnet 42b, and an antenna 44. Generally, the first magnet section 52a and the second magnet section 52b produce a magnet field (e.g., Bo) along the axis 56 (e.g., a first lateral direction in the direction of an area being sensed), and the antenna 44 produces a RF magnetic field (e.g., Bo) along the axis 58. More specifically, the magnet 42a produces a magnetic field generally in the direction 60a, and the magnet 42b produces a magnetic moment oriented in the direction 60b. While described as a magnetic section 52, it should be noted that each magnetic section 52 may comprise one or multiple magnets. That is, the magnetic section 52 may be a single magnet or comprise multiple magnets.

It should be noted that the first magnet section 52a is separated from the second magnet section 52b by a gap 62 along a second lateral direction (e.g., along axis 58), and that the gap 62 facilitates the formation of a saddle point configuration. Increasing the gap 62 may increase the DOI, but this may impose certain constraints (e.g., size and/or space constraints) on the sensor design. For example, the diameter 64 of a downhole tool 12 may not be large enough to accommodate certain components between magnetic sections 52a, 52b or magnets 42.

In accordance with the present disclosure, a magnet configuration of at least two magnets, where the magnetic fields of at least one magnet partially cancels out the magnetic field gradient of another magnet, may produce a magnetic field profile having gradients of magnetic field at positions different from the saddle point field location that are suitable for producing multiple DOI measurements. It should be noted that NMR signals that may arise from potential DOIs that are at a distance closer to the sensor than the saddle point DOI may be suppressed by the choice of angle, as discussed herein. However, the potential DOIs are typically corrupted by, for example, signal from the borehole mud.

Figure 4:
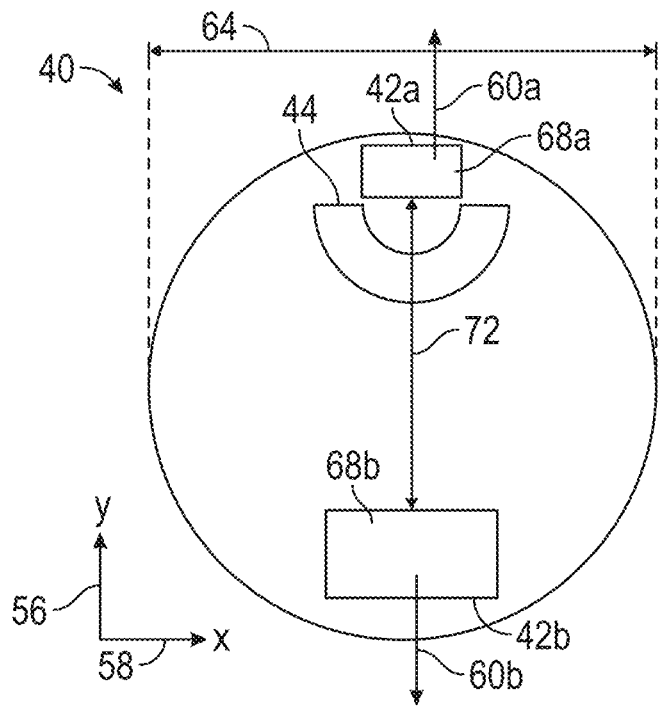
FIG. 4 shows cross-sectional diagrams of an NMR sensor having a configuration of magnets that may produce a saddle point magnetic field with a gradient that is suitable for multiple depths of investigation (DOI) measurements, in accordance with aspects of the present disclosure.

FIG. 4 shows a cross section of an NMR sensor 40 having a configuration of magnets 42 that may produce a magnetic field profile that is suitable for multiple DOI measurements, in accordance with aspects of the present disclosure. As noted above, in some embodiments, the magnets 42 may be magnetic sections 52 and, as such, include one or more magnets 42. In some embodiments, a first DOI measurement may be at the saddle point and a second DOI measurement may be at a greater distance from the NMR sensor 40 than the first DOI.

A benefit of the general design described here is that multiple magnets generate fields that partially cancel out, that is reduce, the magnetic field gradients. The result is to shift the saddle point field location and to produce a suitable range of gradients at other DOIs to allow for multi-DOI measurements. Any NMR signal from possible DOIs closer to the tool than the saddle point DOI can be suppressed by a suitable choice of angles 42 (and similar angles in the other figures) or by changing other parameters in the design. All saddle point designs may be considered capable of multi-DOI measurements since changing frequency does activate a different sample region, however the measurements are typically undesirable by being too low in SNR or being corrupted by NMR signal from the borehole mud. In general, the direction 60a of the magnetic moment produced by magnet 42a is opposite of the direction 60b of the magnetic moment produced by the magnet 42b such that the magnet field gradient produced by magnet 42b is at least partially canceled out by the magnetic field produced by the magnet 42a. That is, the direction 60a is generally in a positive direction along axis 56, and direction 60b is generally in a negative direction along axis 56. In some embodiments, the direction 60b may be greater than 90° from the direction 60a (e.g., an angle having at least some non-zero component along the axis 56). For example, the angle 66 may be 100°, 110°, 120°, 130°, 140°, 150°, 160°, 170°, 180°, 190°, 200°, less than 270°, as well as any angles in between. Furthermore, the cross-sectional area 68a of the magnet 42a is less than the cross-sectional area 68b of the magnet 42b.

Figure 5A:
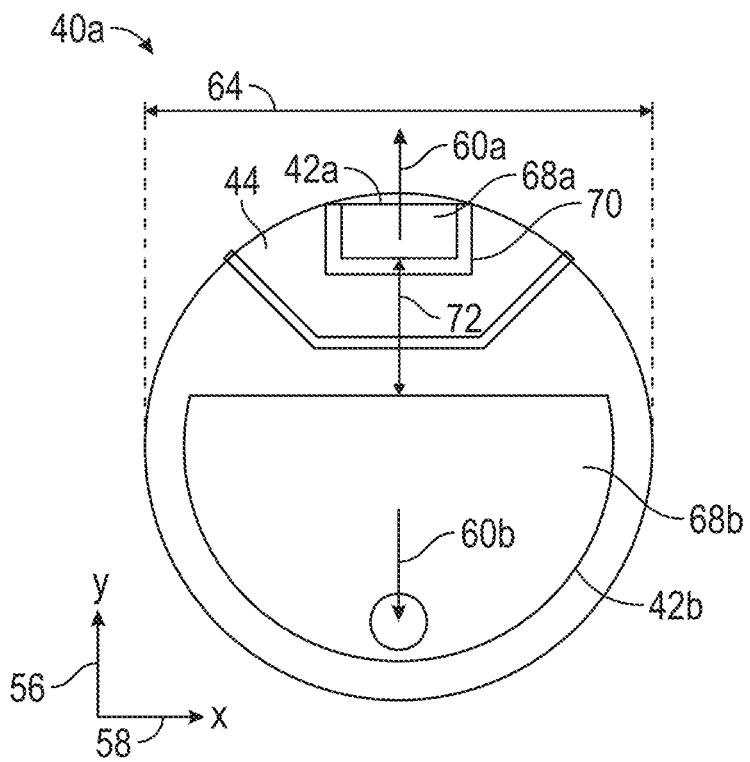
FIG. 5A shows a cross section of a first example of an NMR sensor having a configuration of magnets that may produce a saddle point design with a gradient that is suitable for multiple DOI measurements, in accordance with aspects of the present disclosure.
Figure 5B:
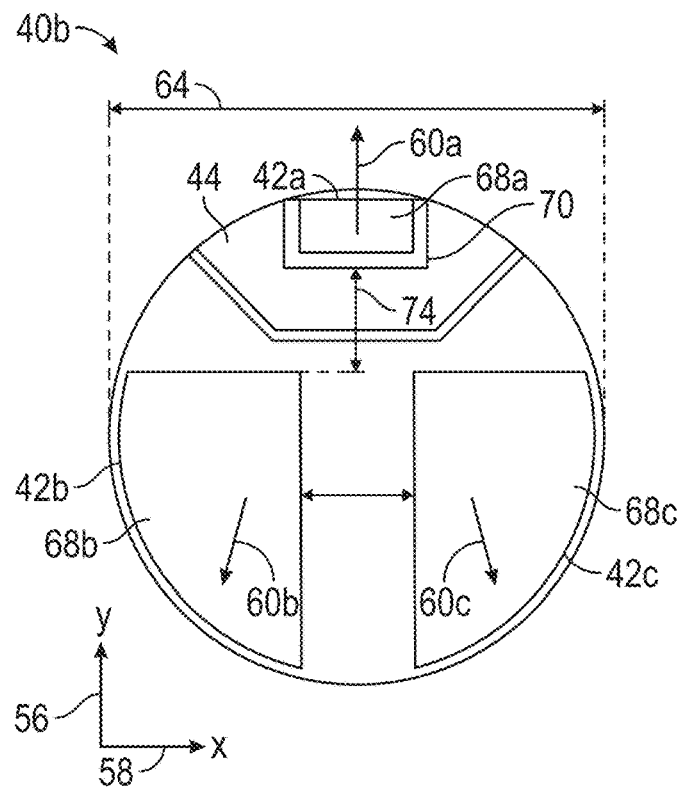
FIG. 5B shows a cross section of a second example of an NMR sensor having a configuration of magnets that may produce a saddle point design with a gradient that is suitable for multiple DOI measurements, in accordance with aspects of the present disclosure.
Figure 5C:
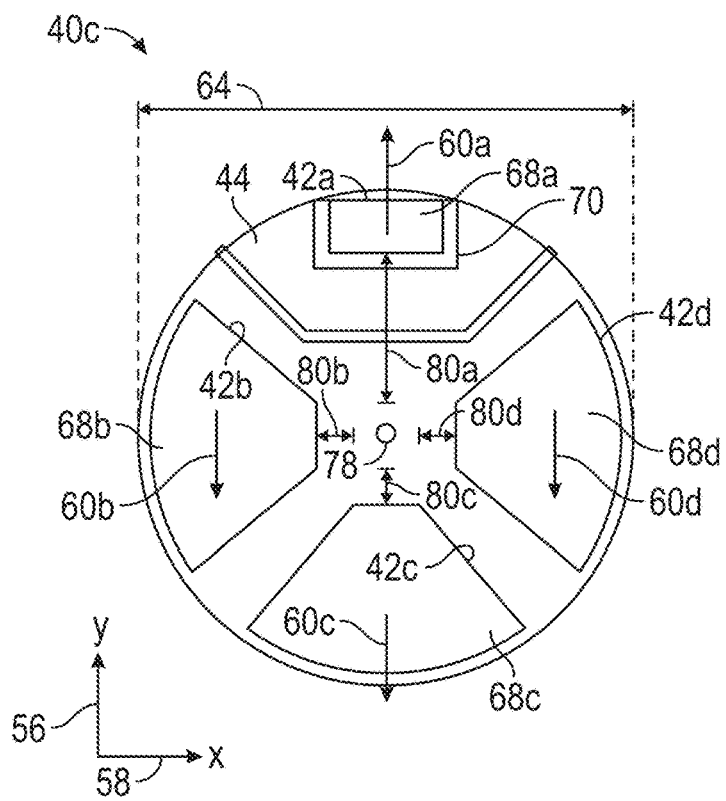
FIG. 5C shows a cross section of a third example of an NMR sensor having a configuration of magnets that may produce a saddle point design with a gradient that is suitable for multiple DOI measurements, in accordance with aspects of the present disclosure.

FIGS. 5A, 5B, and 5C show cross sections of three additional examples of NMR sensors having a configuration of magnets 42 that may produce a saddle point design with a gradient that is suitable for multiple DOI measurements, in accordance with aspects of the present disclosure.

The NMR sensor 40a shown in FIG. 5A includes a first magnet 42a and a second magnet 42b that each generate a magnetic moment along a direction 60, and an antenna 44. As illustrated, the first magnet 42a is disposed within a recess 70 of the antenna 44. In some embodiments, the first magnet 42a may be disposed offset from the antenna 44 (e.g., not within the recess 70). The magnetic moment in the direction 60a generated from the first magnet 42a is in a direction (e.g., generally along the direction) that is generally opposite of the direction 60b of the magnetic moment generated by the second magnet 42b such that at least a portion of the magnetic field gradient in the direction 60b from the second magnet 42b is cancelled out. For example, the magnetic moment in the direction 60a may generate a positive magnetic field component along the axis 56, whereas the magnetic moment in the direction 60a may generate a negative magnetic field component along the axis 56 (e.g., in a negative direction along axis 56). The overall reduction of magnetic field is not desired, but is an acceptable trade off to reduce the magnetic field gradients.

Additionally, the cross-sectional area 68a of first magnet 42a is smaller than the cross-sectional area 68b of the second magnet 42b. Moreover, a volume (not shown) of the magnet 42a may also be smaller than a volume (not shown) of the magnet 42b. As illustrated, the cross-sectional area 68a is approximately $\frac{1}{8}^{th}$ of the cross-sectional area 68b. In some embodiments, the cross-sectional area 68a may be a fraction greater than or less than $\frac{1}{8}^{th}$ (e.g., ½, ¼, ⅕, ⅙, ¹⁄₁₀, and so forth, including any fractions in between).

Additionally, the first magnet 42a is separated from the second magnet 42b by a distance 72 along the axis 56, which is also the axis that includes the magnetic moments 60a and 60b. As illustrated, the distance 72 is approximately less than the radius (e.g., half the diameter 64) of the NMR sensor 40a. In some embodiments, the distance 72 may be equal to or greater than the radius in such embodiments where the cross-sectional areas 68a and 68b are small enough.

The NMR sensor 40b shown in FIG. 5B includes a first magnet 42a, a second magnet 42b, and a third magnet 42c that each generate a magnetic field in a direction 60, and an antenna 44. As illustrated, the first magnet 42a is disposed within a recess 70 of the antenna 44. In some embodiments, the first magnet 42a may be disposed offset from the antenna 44 (e.g., not within the recess 70). In some embodiments, not all (e.g., at least one) of the magnets 42b and 42c may be included in an NMR sensor. As discussed herein, the magnetic moment in the direction 60a generated from the first magnet 42a is in a direction that is generally opposite of the magnetic moment in the direction 60b generated by the second magnet 42b and the third magnet 42c such that at least a portion of the magnetic field from the second magnet 42b and third magnet 42c is cancelled, and simultaneously reducing the overall magnetic field gradient, as desired.

As illustrated, the cross-sectional area 68a of the first magnet 42a is smaller than the cross-sectional areas 68b and 68c of the second magnet 42b and third magnet 42c, respectively. Moreover, as illustrated, the cross-sectional area 68a is approximately $\frac{1}{8}^{th}$ of the cross-sectional areas 68b and 68c. In some embodiments, the ratio of the cross-sectional area 68a and the cross-sectional area 68b and/or 68c may be a fraction greater than or less than $\frac{1}{8}^{th}$ (e.g., ½, ¼, ⅕, ⅙, ¹⁄₁₀, and so forth, including any fractions in between). Additionally, while the cross-sectional area 68b is illustrated as being approximately equal to the cross-sectional area 68c, it should be appreciated that in some embodiments, the cross-sectional area 68b may be greater than or less than the cross-sectional area 68c.

As illustrated, the first magnet 42a is separated from the second magnet 42b and third magnet 42c by a distance 74 generally along the axis 56. Additionally, the second magnet 42b is separated from the second magnet 42c by a distance 76 generally along the axis 58 that is less than the diameter 64 of the NMR sensor. For example, the distance 74 may be less than the radius (e.g., half the diameter 64) of the NMR sensor 40b.

The NMR sensor 40c shown in FIG. 5C includes a first magnet 42a, a second magnet 42b, a third magnet 42c, and a fourth magnet 42d that each generate a magnetic moment in a respective direction 60 such that the total magnetic field of the DOIs may be generally along the position axis 56, and an antenna. As illustrated, the first magnet 42a is disposed within a recess 70 of the antenna 44. In some embodiments, the first magnet 42a may be disposed offset from the antenna 44 (e.g., not within the recess 70). In some embodiments, not all of the magnets 42b, 42c, and 42d may be included in an NMR sensor. In general, the magnetic moment in a direction 60a generated from the first magnet 42a is in a direction along the axis 56 that is generally opposite of the magnetic moment in a direction 60b generated by the second magnet 42b, the magnetic moment in a direction 60c generated by the third magnet 42c, and the magnetic moment in a direction 60d generated by the fourth magnet 42d such that at least a portion of the magnetic fields in the directions 60b, 60c, and 60d from the second magnet 42b, the third magnet 42c, and the fourth magnet 42d is at least partially canceled out, and simultaneously reducing the overall magnetic field gradient as desired.

As illustrated, the cross-sectional area 68a of the first magnet 42a is smaller than the cross-sectional areas 68b, 68c, and 68d of the second magnet 42b, the third magnet 42c, and the fourth magnet 42d, respectively. Moreover, as illustrated, the cross section area 68a is approximately $\frac{1}{4}^{th}$ of the cross-sectional areas 68b, 68c, and 68d. In some embodiments, the ratio of the cross-sectional area 68a and the cross-sectional area 68b, 68c and/or 68d may be a fraction greater than or less than $\frac{1}{4}^{th}$ (e.g., ½, ⅓, ⅕, ⅙, ¹⁄₁₀, and so forth, including any fractions in between). Additionally, while the cross-sectional area 68b, 68c, and 68d are illustrated as being approximately equal, it should be appreciated that in some embodiments, the cross-sectional area 68b, 68c, and 68d may be different.

As illustrated, the first magnet 42a is disposed at a position from a radial center 78 of the NMR sensor 40c by a radially distance 80a, the second magnet 42b is disposed at a position from the radial center 78 by a distance 80b, the third magnet 42c is disposed at a position from the radial center 78 by a distance 80c, and the fourth magnet 42d is disposed at a position from the radial center 78 by a distance 80d. As illustrated, the distances 80b, 80c, and 80d are approximately equal; however, in some embodiments at least one of the distances 80b, 80c, and 80d may be different.

Figure 6:
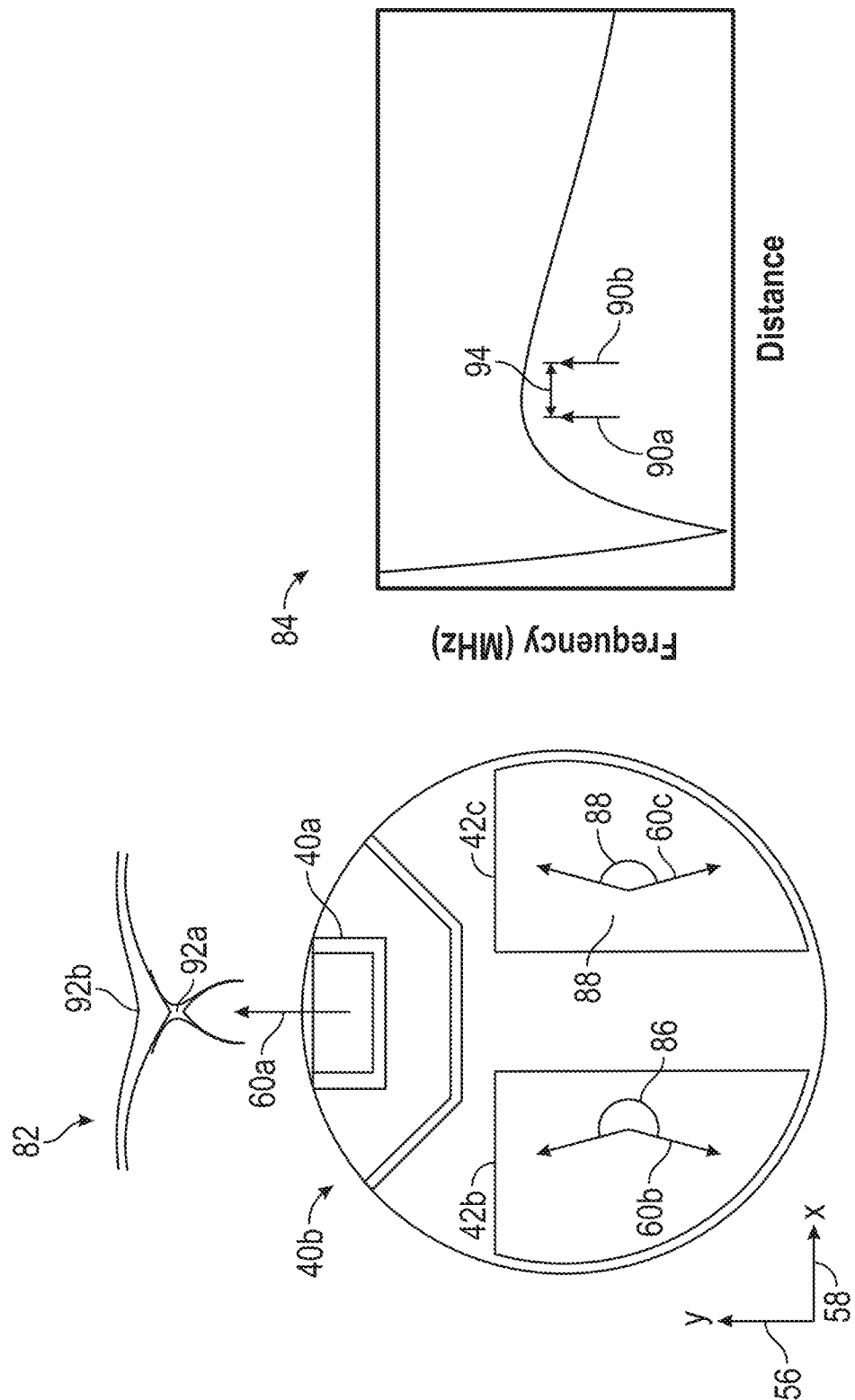
FIG. 6 shows a flux density map and a magnetic field profile of an example of the NMR sensor shown in FIG. 5B, in accordance with aspects of the present disclosure.

FIG. 6 shows a flux density map 82 and a magnetic field profile 84 of an embodiment of the NMR sensor 40b shown in FIG. 5B, in accordance with an embodiment of the present disclosure. As illustrated, the magnet 42b is producing a magnetic moment in a direction 60b that is generally radially offset from the magnetic moment in a direction 60a produced by the first magnet 42a at an angle 86 that is 192°. The magnet 42c is producing a magnetic moment in a direction 60c that is generally radially offset from the magnetic moment in the direction 60a at an angle 88 that is 168°. It should be appreciated that while the directions of the magnetic fields in the directions 60b and 60c are similar (e.g., the angle 86 is in a direction 180° from the direction 60a of the magnetic field with a 12° degree offset from 180° in a clockwise direction, and the angle 88 is generally in a direction 180° from the direction 60a of the magnetic field with a 12° degree offset from 180° in a counter-clockwise direction), in some embodiments, the radial offset of the angles 86 and 88 may be different. For example, the angle 86 may be 190, or 10 degrees clockwise from 180, and the angle 88 may be 165, or 15 degrees counter clockwise from 180.

The magnetic field profile 84 is a plot of frequency versus distance (e.g., from the NMR sensor 40b). Two DOIs are indicated by the arrows 90a and 90b which correspond to the positions 92a and 92b on the flux density map 82. The NMR sensor 40c may produce multiple DOI measurements (e.g., at positions 92a and 92b) because the magnetic field profile 84 of the NMR sensor 40c at the positions indicated by the arrows 90a has a gradient that is 0 G/cm (i.e., is at the maximum of the magnetic field profile 84) and 90b has a gradient that is approximately 33 G/cm. Furthermore, the positions (e.g. 92a and 92b) are separated by a distance 94, which is large enough such that there is no interference or substantially no interference (e.g., noise may make up less than 10%) between the two RF signals from the antenna 44. Thus, in operation, the NMR sensor 40b may produce a first set of NMR data at a first frequency that corresponds to the first DOI at position 92a, and produce a second set of NMR data at a second frequency that corresponds to the second DOI at position 92b.

Figure 7:
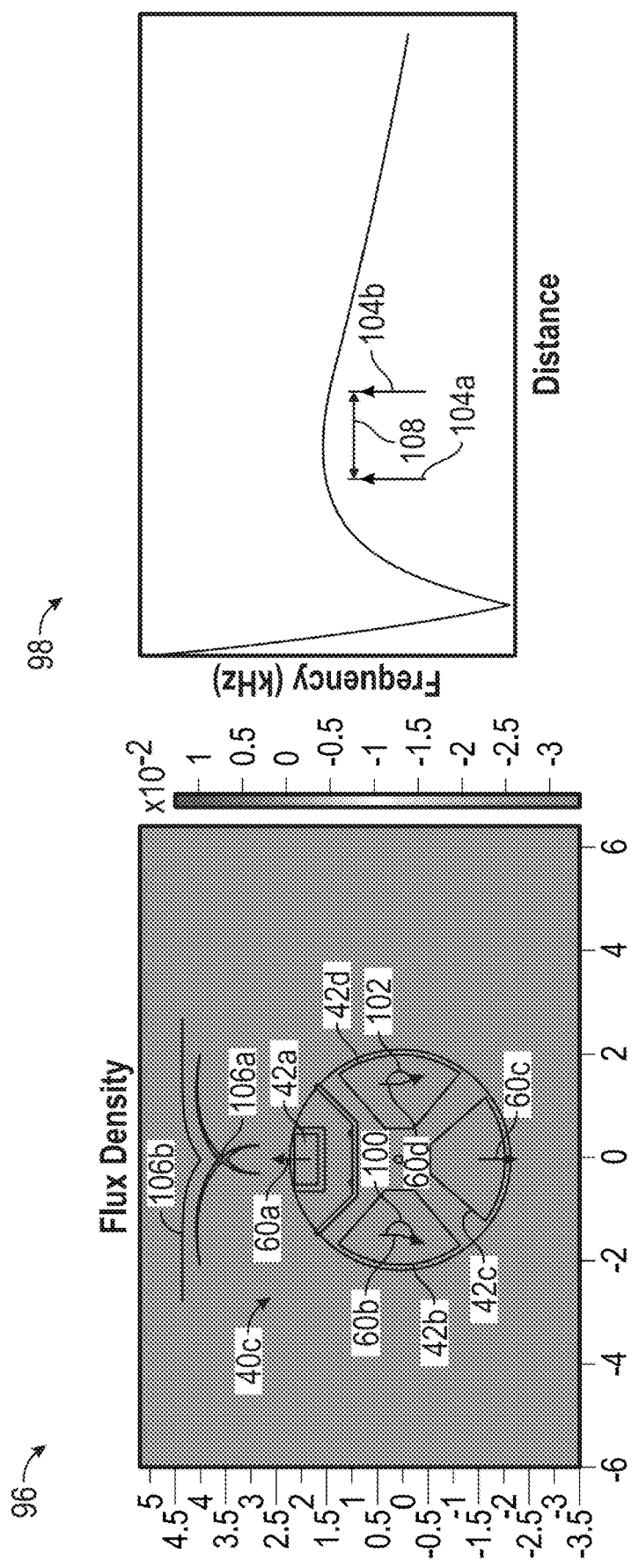
FIG. 7 shows a flux density map and a magnetic field profile of an example of the NMR sensor shown in FIG. 5C, in accordance with aspects of the present disclosure.

FIG. 7 shows a flux density map 96 and a magnetic field profile 98 of an embodiment of the NMR sensor 40c shown in FIG. 5C, in accordance with an embodiment of the present disclosure. As illustrated, the magnet 42b is producing a magnetic moment in a direction 60b that is generally radially offset from the magnetic moment in a direction 60a produced by the magnet 42a at an angle 100 that is 195°. The magnet 42d is producing a magnetic moment in a direction 60d that is generally radially offset from the magnetic moment in the direction 60a at an angle 102 that is 165°. It should be appreciated that while the directions 60b and 60d are illustrated as being similar (e.g., the angle 100 is generally in a direction 180° from the direction 60a of magnetic moment produced by the magnet 42a with a 12° degree offset from 180° in a clockwise direction, and the angle 102 is generally in a direction 180° from the direction of magnetic moment produced by the magnet 42a with a 12° degree offset from 180° in a counter-clockwise direction), in some embodiments, the radial offset of the angles 86 and 88 may be different. For example, the angle 100 may be 190°, or 10° clockwise from 180°, and the angle 102 may be 170°, or 15° counter clockwise from 180°. Additionally, the angle 100 may be 170° and the angle 102 may be 190°. As illustrated, the magnetic moment in the direction 60c is a direction opposite (e.g., 180°) of the magnetic moment in the direction 60a; however, in some embodiments, the magnetic moment in the direction 60c may be offset from the magnetic moment in the direction 60a by an angle between 90° and 270° (e.g., 100°, 110°, 120°, and so forth).

The magnetic field profile 96 is a plot of frequency versus distance (e.g., from the NMR sensor 40c). Two DOIs are indicated by the arrows 104a and 104b which correspond to the positions 106a and 106b on the flux density map 96. The NMR sensor 40c may produce multiple DOI measurements at positions 106a and 106b because the magnetic field profile 98 of the NMR sensor 40c at the positions 104a has a gradient that is 0 G/cm (i.e., is at the maximum of the magnetic field profile 98) and 104b has a gradient that is suitable for multiple DOI measurements, as discussed herein. Furthermore, the distance 108 between the arrows 104a and 104b is large enough such that there is substantially no interference between the two RF signals from the antenna 44 at those two positions. Thus, in operation, the NMR sensor 40c may produce a first set of NMR data at a first frequency that corresponds to the first DOI at position 106a, and produce a second set of NMR data at a second frequency that corresponds to the second DOI at the position 106b.

As a further illustrative example of the techniques discussed herein, FIG. 8 shows a cross section of the NMR sensor 40b shown in FIG. 5B with a configuration of the first magnet 42a, the second magnet 42b, and the third magnet 42c. The positions of the capacitors 54a and 54b are meant to be illustrative, non-limiting examples of positions of one or more capacitors 54.

Figure 9:
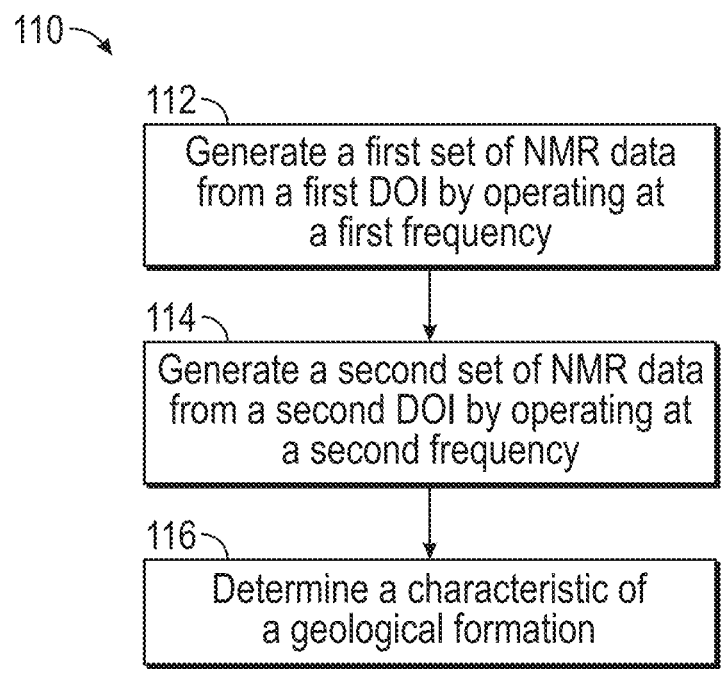
FIG. 9 shows a flow diagram for identifying characteristics of a formation based on NMR data using the configuration of magnets discussed herein, in accordance with aspects of the present disclosure.

FIG. 9 shows a flow diagram 110 for identifying characteristics of a formation based on NMR data using the configuration of magnets discussed herein. The steps illustrated in the flow diagram 110 may be performed via signals sent from the data processing system 28 or any suitable processing device. The flow diagram 110 may include generating (process block 112) a first set of NMR data from a first DOI by operating the antenna at a first frequency. In some embodiments, the antenna 44 may use one or more Carr-Purcell-Meiboom-Gill (CPMG) sequences and burst sequences to acquire a suite of NMR data. The phrase "CPMG" involves acquiring NMR echoes which give rise to T2-based information at a given wait time (polarization). The phrase "bursts" is used to refer to additional CPMG echo trains which are relatively shorter and repeated multiple times to build up signal to noise ratio for intermediate and shorter time constants, which also builds up the T1-based information in the data. In some embodiments, neither the bursts, nor the main CPMG echo trains are pure CPMGs. After generating the first set of NMR data, the data processing system 28 may send suitable control signals to instruct the NMR sensor to generate (process block 114) a second set of NMR data from a second DOI by operating the antenna at a second frequency. Once the second set of NMR data is generated, the data processing system 28 may determine (e.g., identify) (process block 116) a characteristic of the geological formation based on the first set of NMR data and the second set of NMR data. In some embodiments, one or more sets of NMR data may be generated from additional frequencies before the characteristic of the geological formation is determined.

Figure 10:
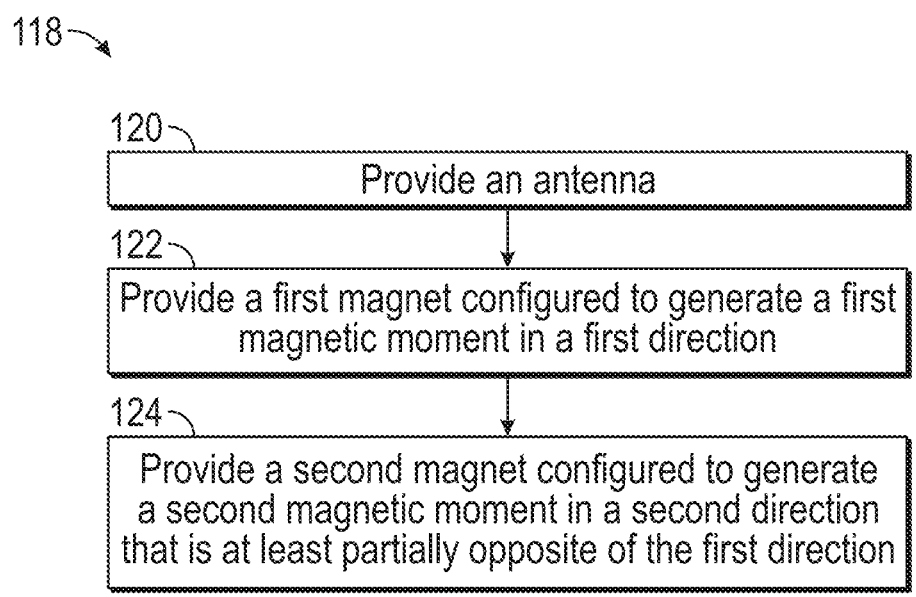
FIG. 10 is a flow diagram for a method of manufacturing an NMR sensor, in accordance with aspects of the present disclosure.

FIG. 10 is a flow diagram 118 for a method of manufacturing an NMR sensor, in accordance with an embodiment of the present disclosure. The flow diagram includes providing (process block 120) an antenna that generates at least one set of NMR data based on RF magnetic fields transmitted and/or received by the antenna. Further, the method includes providing (process block 122) a first magnet at a first radial distance from a radial center of the NMR sensor. As discussed herein, the first magnet is used to generate a first magnetic moment that is generally along a first direction. For example, the first magnet may be magnet 42a as shown in FIGS. 5A, 5B, and 5C. Further, the flow diagram 120 includes providing (process block 124) at a second radial distance from a center of the NMR sensor. As discussed herein, the second magnet is used to generate a second magnetic moment that flows along a second direction, wherein a first angle between the first direction and the second direction is greater than 90 degrees. In some embodiments, the first distance may be shorter than the second distance such that the first magnet is at a radial distance that is close to or proximate the antenna. In some embodiments, the first magnet share a portion of a cross-section of the NMR sensor with the antenna. In some embodiments, a third magnet may be provided or disposed at a third radial distance from a center of the NMR sensor. As discussed herein, the third magnet is used to generate a third magnetic moment that is generally along a third direction that is generally opposite of the first direction, and a second angle between the third direction and the first direction is greater than 90 degrees. Further still, in some embodiments, a fourth magnet may be provided or disposed at a fourth radial distance from a center of the NMR sensor. The fourth magnet is used to generate a fourth magnetic moment that is generally along a fourth direction that is generally opposite of the first direction. A third angle between the fourth direction and the first direction is greater than 90 degrees.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A device for generating nuclear magnetic resonance (NMR) data, the device comprising:
a first magnet configured to generate a first magnetic moment that is along a first direction;
a second magnet disposed at a first position separate from the first magnet at a distance along a direction of the device, wherein the second magnet is configured to generate a second magnetic moment that is along a second direction, wherein a first angle between the first direction and the second direction is greater than 90 degrees, wherein a net magnetic field produced by at least the first magnet and the second magnet has a magnetic-field profile that is suitable for multiple depth of investigation measurements (DOI);
a third magnet disposed at a third radial distance from the radial center of the NMR sensor, wherein the third magnet is configured to generate a third magnetic moment along a third direction that is opposite of the first direction, and wherein a second angle between the third direction and the first direction is about 192 degrees;
a fourth magnet disposed at a fourth radial distance from the radial center of the NMR sensor, wherein the fourth magnet is configured to generate a fourth magnetic moment along a fourth direction that is opposite of the first direction, and wherein a third angle between the fourth direction and the first direction is about 168 degrees; wherein the first magnet, the second magnet, the third magnet, and the fourth magnet are separate from each other, wherein a net magnetic field produced by the first magnet, the second magnet, and the third magnet has a magnetic field profile that is suitable for multiple depth of investigation measurements (DOI); and
an antenna, wherein the antenna is configured to:
generate a first set of NMR data from a first DOI operating at a first frequency; and
generate a second set of NMR data from a second DOI operating at a second frequency.

2. The device of claim 1, wherein a first cross-sectional area of the first magnet is less than half of a second cross-sectional area of the second magnet.

3. The device of claim 1, wherein the first radial distance is greater than the second radial distance, the third radial distance, and the fourth radial distance.

4. The device of claim 1, wherein the distance between the first magnet and the second magnet is less than a radius of the device.

5. The device of claim 1, wherein the first magnet is disposed within a recess of the antenna.

6. The device of claim 1, wherein the distance is a lateral distance.

7. The device of claim 1, wherein the second frequency is pulsed sequentially after the first frequency.

8. The device of claim 1, wherein there are more than two frequencies of operation.

9. A downhole tool for measuring properties of a geological formation, the downhole tool comprising:
a nuclear magnetic resonance (NMR) sensor, wherein the NMR sensor comprises:

a first magnet disposed at a first radial distance from a radial center of the NMR sensor, wherein the first magnet is configured to generate a first magnetic moment that is along a first direction;

a second magnet disposed at a second radial distance from the radial center of the NMR sensor, wherein the second magnet is configured to generate a second magnetic moment along a second direction, wherein a first angle between the first direction and the second direction is greater than 90 degrees;

a third magnet disposed at a third radial distance from the radial center of the NMR sensor, wherein the third magnet is configured to generate a third magnetic moment along a third direction that is opposite of the first direction, and wherein a second angle between the third direction and the first direction is greater than 90 degrees;

a fourth magnet disposed at a fourth radial distance from the radial center of the NMR sensor, wherein the fourth magnet is configured to generate a fourth magnetic moment along a fourth direction that is opposite of the first direction, and wherein a third angle between the fourth direction and the first direction is greater than 90 degrees;

wherein the first magnet, the second magnet, the third magnet, and the fourth magnet are separate from each other, wherein a net magnetic field produced by the first magnet, the second magnet, and the third magnet has a magnetic field profile that is suitable for multiple depth of investigation measurements (DOI), wherein the first radial distance is greater than the second radial distance, the third radial distance, and the fourth radial distance; and an antenna configured to:
generate a first set of NMR data from a first DOI at a first frequency; and
generate a second set of NMR data from a second DOI at a second frequency.

10. The downhole tool of claim 9, wherein the second angle is 192 degrees and the third angle is 168 degrees.

11. The downhole tool of claim 9, wherein at least one cross-sectional area of the second magnet, the third magnet, and the fourth magnet is different.

12. The downhole tool of claim 9, wherein a cross-sectional area of the first magnet is less than half of at least one cross-sectional area of the second magnet, the third magnet, and the fourth magnet.

13. The downhole tool of claim 9, wherein at least one magnet of the first magnet, the second magnet, the third magnet, and the fourth magnet is a magnet section that comprises multiple magnets.

14. The device of claim 9, wherein the second angle is greater than 180 degrees, and the third angle is less than 180 degrees.

15. The device of claim 9, wherein the first angle is greater than 190 degrees and less than 270 degrees.

16. The device of claim 9, wherein there are more than two frequencies of operation.

17. A method of manufacturing a nuclear magnetic resonance (NMR) sensor for a downhole tool, comprising:
providing an antenna configured to generating at least one set of NMR data;
providing a first magnet at a first radial distance from a radial center of the NMR sensor, wherein the first magnet is configured to generate a first magnetic moment that is along a first direction; and
providing a second magnet at a second radial distance from the radial center of the NMR sensor, wherein the second magnet is configured to generate a second magnetic moment along a second direction, wherein a first angle between the first direction and the second direction is greater than 90 degrees;
providing a third magnet at a third radial distance from the radial center of the NMR sensor, wherein the third magnet is configured to generate a third magnetic moment along a third direction that is opposite of the first direction, and wherein a second angle between the third direction and the first direction is greater than 90 degrees;
providing a fourth magnet at a fourth radial distance from the radial center of the NMR sensor, wherein the fourth magnet is configured to generate a fourth magnetic moment along a fourth direction that is opposite of the first direction, and wherein a third angle between the fourth direction and the first direction is greater than 90 degrees, wherein the first radial distance is greater than the second radial distance, the third radial distance, and the fourth radial distance.

* * * * *